United States Patent
Hatano et al.

[11] Patent Number: 6,130,378
[45] Date of Patent: Oct. 10, 2000

[54] SOLAR BATTERY

[75] Inventors: Takuji Hatano, Suita; Miyuki Teramoto, Kobe, both of Japan

[73] Assignee: Minolta Co., Ltd., Osaka, Japan

[21] Appl. No.: 09/283,950

[22] Filed: Apr. 1, 1999

[30] Foreign Application Priority Data

Apr. 30, 1998 [JP] Japan ................................. 10-119799

[51] Int. Cl.[7] .................................................. H01L 35/00
[52] U.S. Cl. ........................ 136/206; 136/255; 136/256
[58] Field of Search .................................. 136/206, 252, 136/255, 256

[56] References Cited

PUBLICATIONS

*J. Am. Chem. Soc.* 1993, 115, pp:6382–90, *Conversion of Light to Electricity by cis–$X_2$ Bis (2,2'–bipyridyl–4,4'–dicarboxylate)ruthenium(II) Charge–Transfer Sensitizers($X=Cl^{31}$, Br–, $I^{31}$, $CN^{31}$, and $SCN^{31}$) on Nanocrystalline $TiO_2$ Electrodes*, M.K. Nazeeruddin, A. Kay, I. Rodicio, R. Humphry–Baker, E. Müller, P. Liska, N. Vlachopoulos, and M. Grätzel. No month available.

*Primary Examiner*—Kathryn Gorgos
*Assistant Examiner*—Thomas H Parsons
*Attorney, Agent, or Firm*—Morrison & Foerster, LLP

[57] ABSTRACT

The object of the present invention is, in a solar battery where at least an electrolyte and a porous member of an oxide semiconductor retaining a pigment material are provided between a transparent electrode and a counter electrode, to obtain a high conversion efficiency by improving the contact between the transparent electrode and the porous member of the oxide semiconductor. In order to achieve the above-mentioned object, in the solar battery according to the present invention where at least the electrolyte 6 and the porous member 3 of an oxide semiconductor retaining pigment material are provided between the transparent electrode 1 and the counter electrode 5, a finely-formed film 8 made of the same oxide semiconductor as the porous member 3 is further provided between the transparent electrode 1 and the porous member 3 of the oxide semiconductor.

16 Claims, 4 Drawing Sheets

SOLAR BATTERY

This application is based on application No. HEI10-119799 filed in Japan, the content of which is hereby incorporated by reference.

BACKGROUND OF THE INVENTION

1. Field of the Invention

The present invention relates to a solar battery which utilizes an oxide semiconductor. More specifically, the present invention relates to a solar battery in which at least an electrolyte and a porous member of an oxide semiconductor retaining a pigment material are provided between a transparent electrode and a counter electrode, and whose conversion efficiency has been increased by improving the contact between the transparent electrode and the porous member of the oxide semiconductor.

2. Description of the Related Art

As solar batteries, silicon of single crystal, polycrystal, or amorphous type have been so far used for their semiconductor materials; however, solar batteries with such silicon have a disadvantage of high production cost.

For this reason, in recent years, development of solar batteries utilizing inexpensive oxide semiconductors such as a titanium oxide has been considered.

However, since an oxide semiconductor made of a titanium oxide or another oxide mainly absorbs light from outside the ultraviolet range, solar batteries utilizing an oxide semiconductor have an extremely poor utilization efficiency of sunlight, resulting in a low conversion efficiency.

In order to solve this problem, it has been tried to improve the utilization efficiency of sunlight by adding a pigment to such an oxide semiconductor. In particular, it has been suggested, in recent years, to improve a conversion efficiency in a solar battery with an oxide semiconductor by using a porous member as an oxide retaining member so as to increase the surface area and make the porous member retain the pigment.

One such solar battery comprising a porous member of an oxide semiconductor retaining a pigment is shown in FIG. 1, in which a transparent electrode 2 made of a tin oxide or the like is provided on the surface of the transparent substrate 1 made of a glass substrate or the like, a porous member 3 of an oxide semiconductor made of a titanium oxide or the like is further provided on the transparent electrode 2, and a pigment material is retained by the porous member 3 of the oxide semiconductor. Furthermore, an electrolyte 6 is provided between the porous member 3 and the counter electrode 5 disposed on the substrate 4, and a sealing member 7 is provided so as to seal their circumference.

In forming the porous member 3 of an oxide semiconductor onto the transparent electrode 2, according to a conventional method, a disperse solution of the oxide semiconductor is applied onto the transparent electrode 2 and then the electrode 2 is sintered so as to form the porous member 3 of the oxide semiconductor.

BRIEF SUMMARY OF THE INVENTION

However, the inventors of the present invention have directed their attention to the fact that the disperse solution of an oxide semiconductor generally has poor leakage against the transparent electrode 2, which prevents the porous member 3 of the oxide semiconductor from being successfully formed on the transparent electrode 2.

The inventors also have given their attention to the problem that when the porous member 3 of an oxide semiconductor is formed by applying the disperse solution of the oxide semiconductor onto the transparent electrode 2 and then sintering this electrode, the poor contact between the porous member 3 of the oxide semiconductor and the transparent electrode 2 increases the resistance between them, thereby decreasing the conversion efficiency of the obtained solar battery.

The present invention has an object of solving these problems.

To be more specific, the object of the present invention is to obtain a solar battery having a high conversion efficiency by improving the contact between the transparent electrode and the porous member of an oxide semiconductor retaining pigment material.

In order to achieve the object, in the solar battery according to the present invention where at least an electrolyte and a porous member of an oxide semiconductor retaining pigment material are provided between a transparent electrode and a counter electrode, a finely-formed film made of the same oxide semiconductor as the porous member is further provided between the transparent electrode and the porous member of the oxide semiconductor.

As in the solar battery according to the present invention, when the finely-formed film made of the same oxide semiconductor as the porous member is provided between the transparent electrode and the porous member of the oxide semiconductor, the contact between the transparent electrode and the porous member of the oxide semiconductor is improved via the finely-formed film, and as a result, the conversion efficiency in the solar battery is improved.

BRIEF DESCRIPTION OF THE DRAWINGS

These and other objects and features of the present invention will become apparent from the following description of preferred embodiments thereof taken in conjunction with the accompanying drawings, in which.

In the following description, like parts are designated by like reference numbers throughout the several drawings.

DETAILED DESCRIPTION OF THE PREFERRED EMBODIMENTS

In the solar battery according to the present invention where at least an electrolyte and a porous member of an oxide semiconductor retaining pigment material are provided between a transparent electrode and a counter electrode, a finely-formed film made of the same oxide semiconductor as the porous member is further provided between the transparent electrode and the porous member of the oxide semiconductor.

As in the solar battery according to the present invention, when the finely-formed film made of the same oxide semiconductor as the porous member is provided between the transparent electrode and the porous member of the oxide semiconductor, the contact between the transparent electrode and the porous member of the oxide semiconductor is improved via the finely-formed film, and as a result, the conversion efficiency in the solar battery is improved.

When the porous member of an oxide semiconductor is formed by forming the finely-formed film onto the transparent electrode, then applying a disperse solution of the oxide semiconductor onto the finely-formed film, and sintering the transparent electrode, the disperse solution is evenly applied onto the finely-formed film, making the porous member of the oxide semiconductor be evenly formed thereonto.

As an oxide semiconductor for the above-mentioned porous member and the finely-formed film, it is possible to use such well-known oxide semiconductors as those made of a titanium oxide, a niobium oxide, a zinc oxide, a zirconium oxide, an indium oxide, or a tin oxide. It is particularly preferable to use a titanium oxide which is unlikely to deteriorate the oxide semiconductor made thereof.

It is preferable that the porous member and the finely-formed film made of the above-mentioned oxide semiconductors should mainly have an anatase-type crystal structure which is produced at a low temperature and has a wide band gap.

Embodiments of the Present Invention

The solar battery in accordance with the present invention will be described more specifically, based on the attached drawings.

Figure 1:
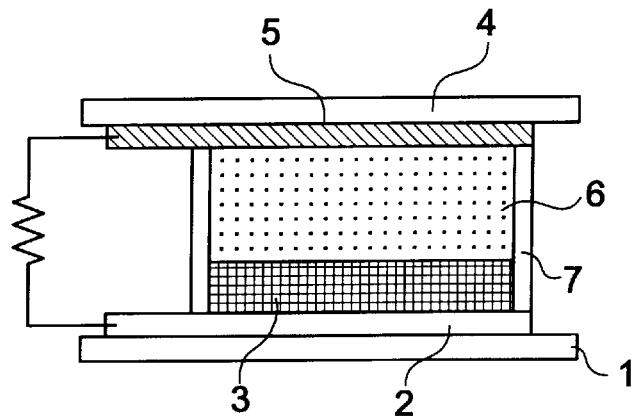
FIG. 1 is a rough cross section showing the structure of a solar battery related to the present invention.
Figure 2:
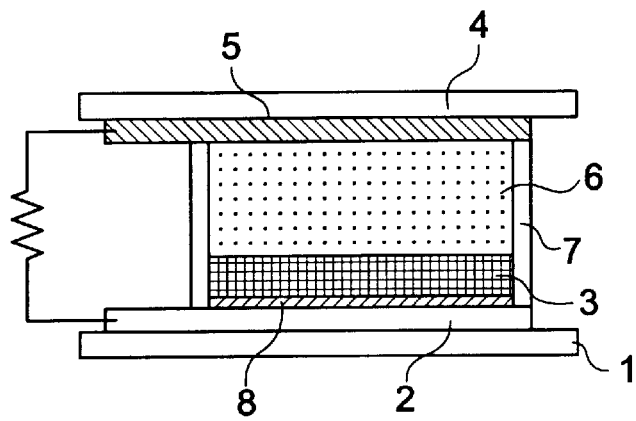
FIG. 2 is a rough cross section showing the structure of the solar battery according to an embodiment of the present invention.

In the solar battery of the present embodiment, as shown in FIG. 2, the transparent electrode 2 is provided on the surface of the transparent substrate 1 made of a glass substrate or the like, and the finely-formed film 8 made of the same oxide semiconductor as the porous member 3 is further provided on the transparent electrode 2.

As material for the transparent electrode 2, a tin oxide, an indium-tin oxide (ITO), or the like, which is generally used, can be used.

In order to produce the finely-formed film 8 made of the same oxide semiconductor as the porous member 3 onto the transparent electrode 2, it is possible to employ an oxygen reaction deposition method, an ion plating method, a sputtering method, a chemical vapor-phase deposition method (CVD), or a sol-gel method with a solution such as alkoxide of an oxide semiconductor.

After the finely-formed film 8 of an oxide semiconductor is formed, the porous member 3 of an oxide semiconductor is provided on the finely-formed film 8 and the porous member 3 of the oxide semiconductor is made to retain pigment material. Furthermore, the electrolyte 6 is provided between the porous member 3 and the counter electrode 5 disposed on the substrate 4, and a sealing member 7 is provided so as to seal their circumference.

As pigment material to be retained by the porous member 3 of an oxide semiconductor, those having an excitation energy level higher than the energy level of the conduction band of the oxide semiconductor and also having thermal resistance are preferable. For example, a ruthenium complex, phthalocyanine, or eosin can be used.

As the electrolyte 6, a solid electrolyte or an electrolytic solution which uses I-/I3- or the like as oxidation-reduction pair can be used, and as the counter electrode 5, generally employed electrode material can be used. As the above-mentioned sealing material, thermoplastic resins are preferable because of their features of not being degenerated by the electrolyte 6 and being easy to handle.

The solar batteries in accordance with the embodiments of the present invention will be described more specifically hereinafter, and the improvement of the conversion efficiency in these solar batteries will be proved by comparing these batteries with the battery of Comparative Example.

(Embodiments 1 to 5)

The solar batteries of Embodiments 1 to 5, which have a structure shown in FIG. 2, are commercial articles (Nippon Sheet Glass Co., Ltd.: CS-4Z117-P110C-F-C20) each comprising a transparent substrate 1 made of a glass substrate, and a transparent electrode 2 made of a tin oxide with doped fluorine formed on the transparent substrate 1. Their sheet resistance value is 30 Ω/□ or below.

Figure 3:
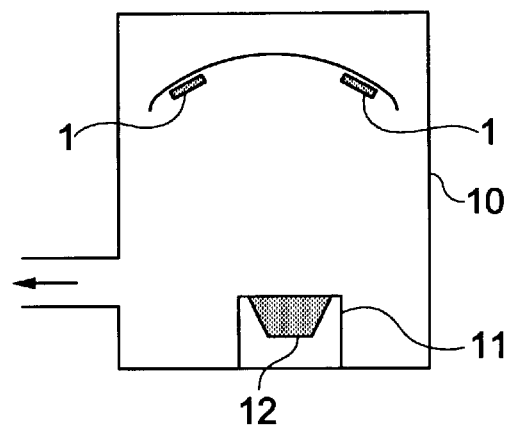
FIG. 3 is a rough illustration of a vacuum deposition device with which a finely-formed film of a titanium dioxide is formed on the transparent electrode provided on the transparent substrate in an embodiment of the present invention.

As shown in FIG. 3, after the transparent substrate 1 having the transparent electrode 2 thereon was set inside a vacuum deposition device 10, the pressure inside the device 10 was set to $5 \times 10^{-5}$ Torr, and TiOx (x=1 to 2) which is a film material 12 was heated by the heater 11. Furthermore, the substrate temperature of the transparent substrate 1 was set to 300° C. and oxygen gas was introduced until the pressure reached $2 \times 10^{-4}$ Torr. Under these conditions, a titanium dioxide was deposited onto the transparent electrode 2 provided on the transparent substrate 1, and the finely-formed film 8 of an oxide semiconductor made of a titanium dioxide was formed on the transparent electrode 2 in such a manner as to have a predetermined thickness. Then, the transparent substrate 1 having the finely-formed film 8 of a titanium dioxide thereon was heat-treated at 450° C. for 15 minutes in an electric furnace, so as to make the crystal structure of the titanium dioxide composing the finely-formed film 8 anatase-type.

The thickness of the finely-formed film 8 of a titanium dioxide formed on the transparent electrode 2 was made 300 Å in Embodiment 1, 500 Å in Embodiment 2, 1000 Å in Embodiment 3, 2000 Å in Embodiment 4, and 4000 Å in Embodiment 5, respectively.

After the finely-formed film 8 of a titanium dioxide was thus formed, a commercially available titanium dioxide sol (Solaronix: STO-3) comprising fine particles of a titanium dioxide dispersed in a solvent was applied onto the finely-formed film 8 and dried. Then, each transparent substrate 1 was heat-treated at 450° C. for 15 minutes in an electric furnace so as to sinter the titanium dioxide. As a result, the porous member 3 of an oxide semiconductor made of a titanium dioxide mainly having an anatase-type crystal structure was formed on the finely-formed film 8 in such a manner as to have a thickness of 10 μm.

After cooling each transparent substrate 1 having the porous member 3 of a titanium dioxide thereon, the substrate 1 was soaked in an ethanol solution containing $4.7 \times 10^{-4}$ mole of pigment material which comprises a ruthenium complex (Solaronix: Ruthenium 535) comprising cis-bis (isothiocyanato)-bis(2,2'-bipyridyl-4,4'-di-carboxylato) ruthenium (II) shown in Chemical formula 1 below. After the porous member 3 was made to absorb the pigment material at 80° C. for two hours, the surface was cleaned with ethanol.

[Chemical Formula 1]

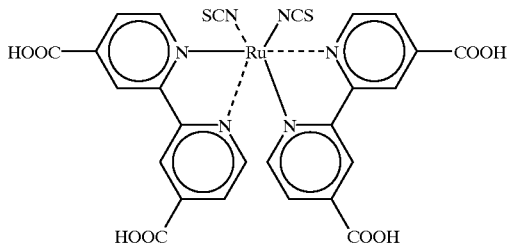

Then, the glass substrate 4 having the counter electrode 5 made of platinum thereon was disposed in such a manner that the counter electrode 5 faced the porous member 3, and the sealing member 7 made of a thermoplastic resin (Du Pont-Mitsui Polychemicals Co., Ltd.: HIMILAN) was provided around the circumference. Furthermore, an electrolytic solution (Solaronix: Iodolyte GD50), which uses I-/I3- as oxidation-reduction pair, was poured as the electrolyte 6 between the porous member 3 and the counter electrode 5, and the sealing member 7 was provided for sealing.

COMPARATIVE EXAMPLE 1

In Comparative Example 1, a solar battery was produced in the same manner as in Embodiments 1 to 5 except that no finely-formed film 8 of a titanium dioxide which is an oxide semiconductor was provided on the transparent electrode 2.

COMPARATIVE EXAMPLE 2

In Comparative Example 2, a commercial article comprising the transparent substrate 1 made of the same glass substrate as those used in Embodiments 1 to 5 and the transparent electrode 2 made of a tin oxide with doped fluorine was used, and a 10% disperse solution consisting of 30 nm-diameter fine particles of a titanium dioxide (C. I. KASEI Co., Ltd.: NanoTek Titanum dioxide) dispersed in water was applied onto the transparent electrode 2.

When the disperse solution of fine particles of a titanium dioxide was applied onto the transparent electrode 2, the disperse solution was unsuccessful in being evenly applied onto the transparent electrode 2 because the surface of the transparent electrode repelled the solution.

COMPARATIVE EXAMPLE 3

In the present example, a commercial article comprising a transparent substrate 1 made of a glass substrate and a transparent electrode 2 made of a tin oxide with doped fluorine formed on the transparent substrate 1 was used in the same manner as in Embodiments 1 to 5. Furthermore, a commercially available titanium dioxide sol (Solaronix: Ti-Nanoxide HT) comprising 13 nm-diameter fine particles of a titanium dioxide dispersed in a solvent was applied onto the transparent electrode 2. Then, the transparent substrate 1 was heat-treated at 450° C. for 15 minutes so as to sinter the titanium dioxide, and as a result, the porous member 3 of an oxide semiconductor made of a titanium dioxide was formed on the transparent electrode 2.

When the transparent substrate 1 having the porous member 3 thereon was cooled to the room temperature, a 0.2 mol titanium tetrachloride aqueous solution was dropped on the surface of the porous member 3, which was left in order to be dried.

As a result, the porous member 3 of an oxide semiconductor made of a titanium dioxide partly came off the surface of the transparent electrode 2.

The output characteristics of the solar batteries of Embodiments 1 to 5 and Comparative Example 1 were measured.

Figure 4:
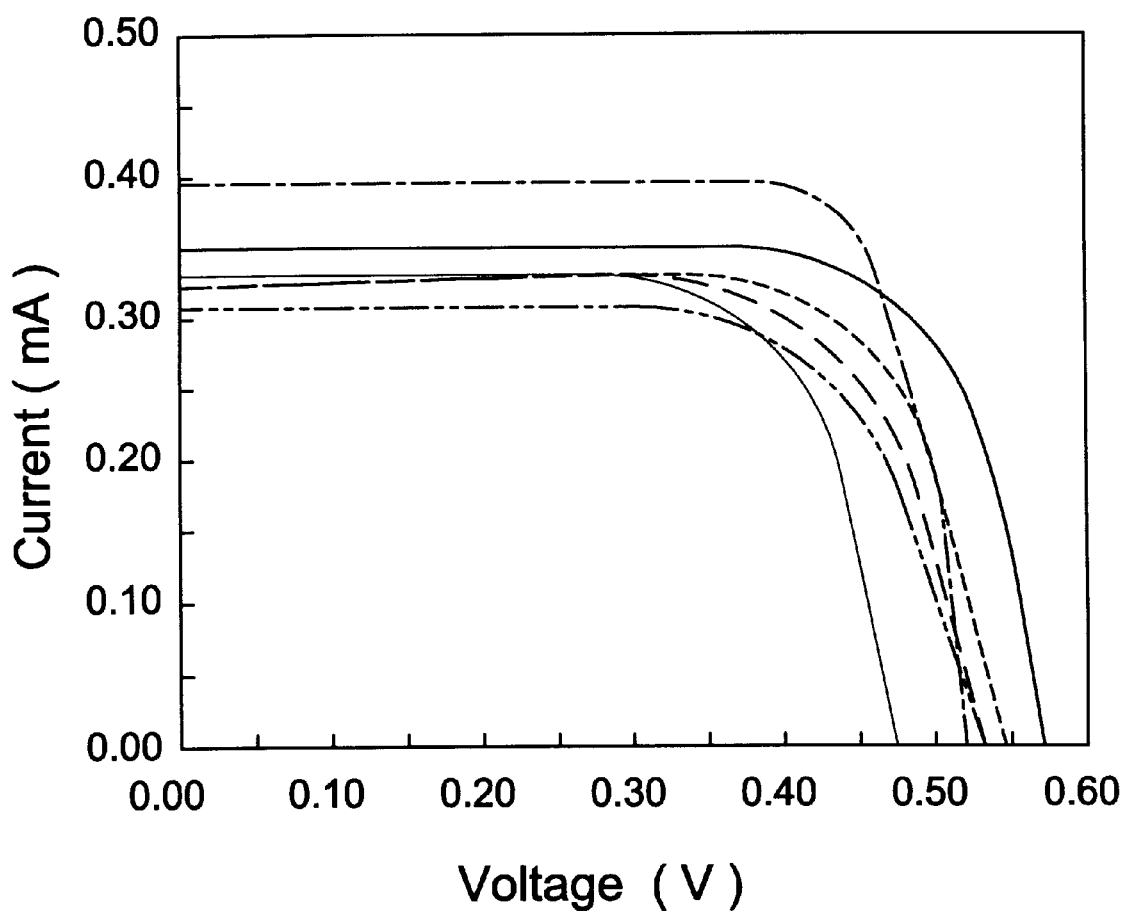
FIG. 4 is a graph showing output characteristic curves in the solar batteries of Embodiments 1 to 5 of the present invention and Comparative Example 1.

For the measurement of the output characteristics, a halogen lamp (MORITEX: MHF-150L) was used as a light source and light having an illuminance of $0.13 \text{ mW}/0.5 \text{ cm}^2$ was applied to each solar battery, so as to obtain the output characteristic curves as shown in FIG. 4.

Figure 5:
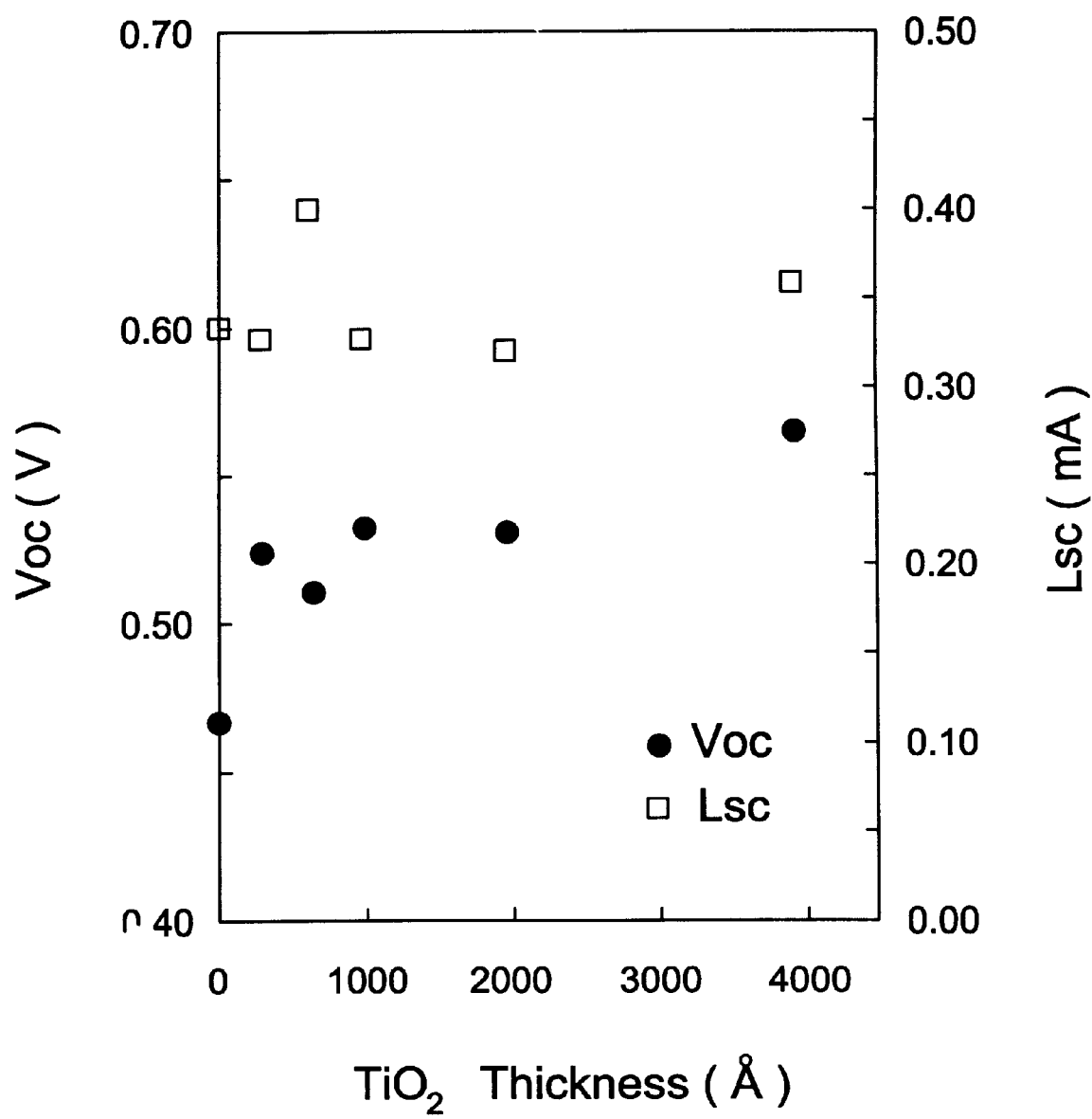
FIG. 5 is a graph showing the relationship among the thickness of the finely-formed film of a titanium dioxide, open voltage Voc, and short-circuit current Isc in the solar batteries of Embodiments 1 to 5 of the present invention and Comparative Example 1.
Figure 6:
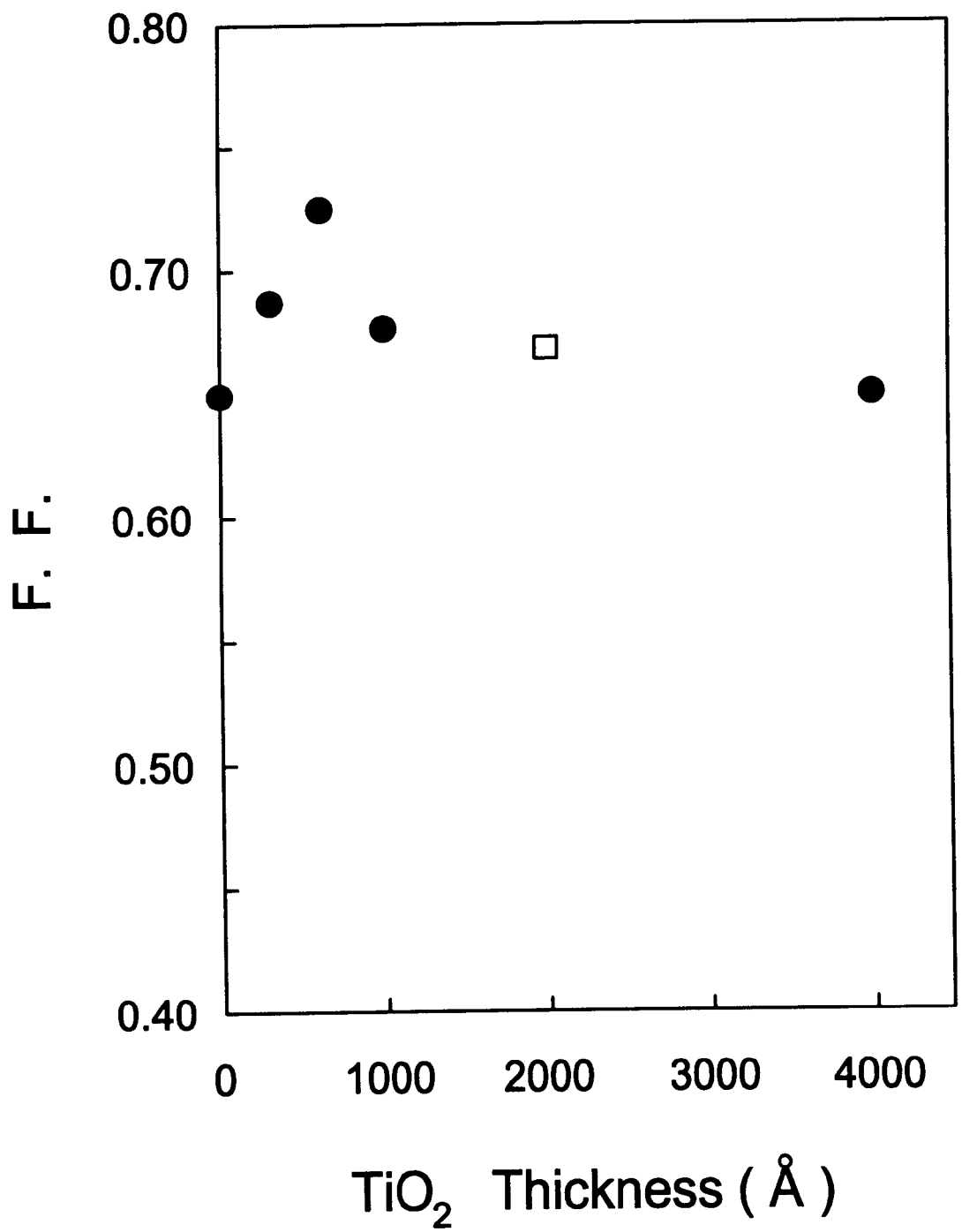
FIG. 6 is a graph showing the relationship between the thickness of the finely-formed film of a titanium dioxide and a form factor F. F. in the solar batteries of Embodiments 1 to 5 of the present invention and Comparative Example 1.

Based on the measurement results, the relationship among the thickness of the finely-formed film 8 of a titanium dioxide, open voltage Voc, and short-circuit current Isc was found as shown in FIG. 5. Furthermore, the relationship between the thickness of the finely-formed film 8 of a titanium dioxide and the form factor F. F. was examined, the results of which are shown in FIG. 6.

The obtained results show that the solar batteries of Embodiments 1 to 5 each comprising the finely-formed film 8 of an oxide semiconductor made of a titanium dioxide which is provided between the transparent electrode 2 and the porous member 3 of an oxide semiconductor made of a titanium dioxide had higher values in both open voltage Voc and form coefficient F. F. than the solar battery of Comparative Example 1 comprising no finely-formed film 8. Thus, the solar batteries of Embodiments 1 to 5 had improved conversion efficiency.

As described hereinbefore, in the solar battery of the present invention where at least an electrolyte and a porous member of an oxide semiconductor retaining a pigment material are provided between a transparent electrode and a counter electrode, a finely-formed film made of the same oxide semiconductor as the porous member is further provided between the transparent electrode and the porous member of the oxide semiconductor. As a result, the contact between the transparent electrode and the porous member of the oxide semiconductor has been improved via the finely-formed film, and consequently, the conversion efficiency of the solar battery has been improved.

As in the present invention, when the porous member of an oxide semiconductor is formed by forming the finely-formed film made of the same oxide semiconductor as the porous member onto the transparent electrode, then applying a disperse solution of the oxide semiconductor onto the finely-formed film, and sintering the transparent electrode, the disperse solution is evenly applied onto the finely-formed film without being repelled, making the porous member of the oxide semiconductor be evenly formed thereonto.

Although the present invention has been fully described by way of examples with reference to the accompanying drawings, it is to be noted that various changes and modifications will be apparent to those skilled in the art. Therefore, unless such changes and modifications depart from the scope of the present invention, they should be construed as being included therein.

What is claimed is:

1. A solar battery comprising:
   a transparent electrode;
   a counter electrode;
   an electrolyte provided between said transparent electrode and said counter electrode;
   a porous member made of an oxide semiconductor, said porous member being provided between said transparent electrode and said counter electrode and retaining a pigment material; and
   a finely-formed film provided between said transparent electrode and said porous member of the oxide semiconductor, said finely-formed film being made of the same oxide semiconductor as said porous member.

2. The solar battery of claim 1, wherein the oxide semiconductor is made of a titanium oxide.

3. The solar battery of claim 2, wherein a crystal structure of the titanium oxide composing said finely-formed film comprises an anatase.

4. The solar battery of claim 1, wherein the oxide semiconductor is selected from the group consisting of a titanium oxide, a niobium oxide, a zinc oxide, a zirconium oxide, an indium oxide, and a tin oxide, and the pigment material is selected from the group consisting of a ruthenium complex, phthalocyanine, and eosin.

5. The solar battery of claim 1, wherein the pigment material is as follows.

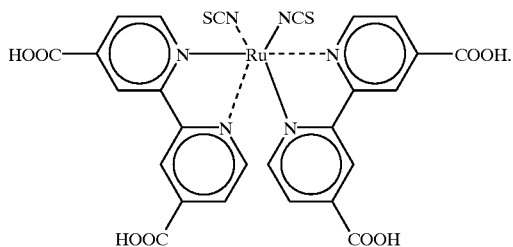

6. The solar battery of claim 1, wherein the finely-formed film has a thickness from 300 Å to 4000 Å.

7. The solar battery of claim 1, wherein the electrolyte is a solid electrolyte or an electrolytic solution.

8. The solar battery of claim 1, further comprising a sealing member made of a thermoplastic resin.

9. The solar battery of claim 1, wherein the finely-formed film is prepared by the method selected from the group consisting of an oxygen reaction deposition method, an ion plating method, a sputtering method, a chemical vapor-phase deposition method and a sol-gel method.

10. The solar battery of claim 1, wherein the porous member is prepared by the method comprising the steps of:
applying a disperse solution of the oxide semiconductor onto the finely-formed film, and
sintering the disperse solution to obtain the porous member.

11. A solar battery comprising:

a first electrode;

a second electrode;

an electrolyte provided between said first and second electrode;

a porous member made of an oxide semiconductor;

a pigment material retained by the porous member; and a finely-formed film provided between said first electrode and said porous member, said finely-formed film being made of an oxide semiconductor.

12. The solar battery of claim 11, wherein a crystal structure of the titanium oxide composing said finely-formed film comprises an anatase.

13. The solar battery of claim 11, wherein the oxide semiconductor is selected from the group consisting of a titanium oxide, a niobium oxide, a zinc oxide, a zirconium oxide, an indium oxide, and a tin oxide, and the pigment material is selected from the group consisting of a ruthenium complex, phthalocyanine, and eosin.

14. The solar battery of claim 11, wherein the oxide semiconductor of the porous member is made of a titanium oxide.

15. The solar battery of claim 14, wherein the oxide semiconductor of the finely-formed film is made of a titanium oxide.

16. The solar battery of claim 11, wherein the pigment material is as follows.

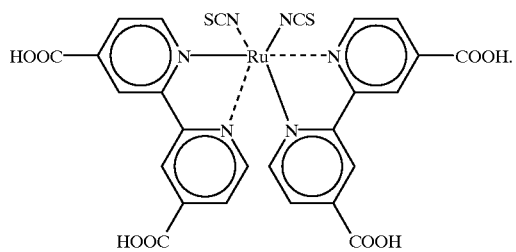

* * * * *